United States Patent [19]
Barber et al.

[11] Patent Number: 6,101,371
[45] Date of Patent: Aug. 8, 2000

[54] ARTICLE COMPRISING AN INDUCTOR

[75] Inventors: Bradley Paul Barber, Chatham; Nathan Belk, Scotch Plains; David J. Bishop, Summit; Peter L. Gammel, Millburn, all of N.J.

[73] Assignee: Lucent Technologies, Inc., Murray Hill, N.J.

[21] Appl. No.: 09/152,189

[22] Filed: Sep. 12, 1998

[51] Int. Cl.[7] .............................. H04B 1/38; H04B 5/00
[52] U.S. Cl. ............................ 455/73; 455/41; 455/318; 336/87; 336/134; 336/178; 331/361; 331/181; 333/167; 333/174
[58] Field of Search .................................. 455/41, 73, 76, 455/255, 256, 257, 258, 259, 260, 264, 314, 315, 318, 375; 336/10, 65, 87, 130, 134, 178, 199, 200, 225, 207, 208; 331/36 L, 36 R, 181; 333/167, 174, 175

[56] References Cited

U.S. PATENT DOCUMENTS

| | | | |
|---|---|---|---|
| 3,697,911 | 10/1972 | Strauss, Jr. | 336/130 |
| 3,932,824 | 1/1976 | Wycoff | 333/167 |
| 4,733,190 | 3/1988 | Dembinski | 336/65 |
| 5,437,057 | 7/1995 | Richley et al. | 455/41 |
| 5,635,750 | 6/1997 | Schlaak et al. | |
| 5,745,013 | 4/1998 | Hohmann | 331/181 |
| 5,898,909 | 4/1999 | Yoshihara et al. | 455/73 |
| 5,977,660 | 11/1999 | Mandalakas et al. | 333/167 |

FOREIGN PATENT DOCUMENTS

| | | |
|---|---|---|
| WO 94/17558 | 8/1994 | WIPO. |
| WO 96/28841 | 9/1996 | WIPO. |

OTHER PUBLICATIONS

Young et al., "A Low–Noise RF Voltage–Controlled Oscillator Using On–Chip High–Q Three–Dimensional Coil Inductor and Micromachined Variable Capacitor," Tech Dig., pp. 128–131, Solid–State Sensor and Actuator Workshop, Jun. 8–11, 1998, Hilton Head Island, South Carolina.

Fan et al., "Universal MEMS Platforms for Passive RF Components: Suspended Inductors and Variable Capacitors," IEEE Proc., pp. 29–33, Eleventh Annual Int'l. Conf. MEMS, Jan. 25–29, 1998, Heidelberg, Germany.

"MEMS Technology Pursued for the Development of Micromachined Silicon Variable Inductors and Latching Accelerometers," Elec. Design, Jun. 23, 1997.

*Primary Examiner*—Dwayne D. Bost
*Assistant Examiner*—Quochien B. Vuong

[57] ABSTRACT

An article comprising a micro-machined, passively self-assembling inductor is disclosed. The inductor is fabricated using MEMS technology and advantageously utilizes materials compatible with CMOS such that inductor is monolithically integrable with a CMOS chip. The inductor includes passive self-assembly means by which the inductor loop is moved away from an underlying substrate, typically silicon, in the final steps of inductor assembly. Such passive self-assembly does not require separate actuation or monitoring steps.

22 Claims, 13 Drawing Sheets

ARTICLE COMPRISING AN INDUCTOR

FIELD OF THE INVENTION

The present invention relates to micro-machined inductors suitable for monolithic integration in integrated circuits, and circuits incorporating same.

BACKGROUND OF THE INVENTION

Passive RF components, such as inductors, are used in a variety of important applications in microwave and wireless telecommunications circuits. Illustrative applications for low loss inductors include reactive impedance matching to cancel parasitic capacitance and use as frequency determining elements in filters and oscillators.

In order to reduce costs and to improve reliability, it is desirable, to the extent possible, to provide monolithically-integrated implementations of such microwave and telecommunications circuits. At present, a widely recognized goal in telecommunications is the fabrication of a "single-chip" radio. While many of the components/circuits of a radio can now be readily monolithically integrated into such a single integrated circuit (IC), monolithic integration of low-loss, linear, passive RF components remains problematic.

The difficulties with monolithically integrating low-loss inductors on conventional silicon substrates are well-established. First, inductors fabricated on conducting silicon substrates suitable for forming transistors will be subject to high electrical losses due to the interactions of the inductor's scalar potential with the substrate. A second difficulty involves inductive coupling to the substrate, wherein currents are induced in the substrate due to a vector potential produced by the inductor. Such induced currents degrade inductor performance. Third, dielectric properties of silicon increase parasitic capacitance, thereby lowering the maximum operating frequency of such inductors. And fourth, relatively thick metal layers are required to reduce losses in the inductor structure itself.

As a result of the aforedescribed problems associated with monolithic integration, inductors are typically fabricated "off chip" and assembled either as part of a multi-chip module (MCM) or implemented at the board level as discrete components. Both such approaches involve more assembly steps and more cost than a monolithically-implemented device. Moreover, the parasitic inductance and parasitic capacitance of MCMs or board-level implementations, and the corresponding lack of reproducibility of such parasitic forces, can require that additional functionality (i.e., circuits) is moved off chip. Variable-frequency oscillators (VFOs), for example, typically use discrete off-chip inductors and capacitors for such reasons.

Of late, micro-electromechanical systems (MEMS) technology has been used to address the problems inherent in monolithically integrating low loss, passive RF components. Using MEMS, the functionality of an inductor, and particularly a low loss inductor, can be realized by various implementations of micron-sized electromechanical structures. MEMS-based inductors address the aforedescribed monolithic-integration difficulties by increasing the effective distance between the substrate and the inductor. While some of the MEMS-based, integrable, low-loss inductors that have been proposed to date have effectively addressed the aforedescribed "standard" integration difficulties, they do, Unfortunately, present other problems, as described below.

In a first MEMS-based inductor, the silicon substrate beneath a micron-sized inductor loop is chemically modified in an electrochemical process, or selectively removed, such as by wet etching (commonly referred to as "bulk micromachining"). While difficulties related to the proximity between the inductor coil and the substrate are thereby lessened, the additional processing steps incurred, particularly the required "backside" processing of the silicon wafer, complicate wafer handling and disadvantageously increase production costs. See Von Arx et al., "On-Chip Coils with Integrated Cores for Remote Inductive Powering of Integrated Microsystems," Digest of Tech Papers, 1997 Int'l. Conf. Solid-State Sensors and Actuators (Transducers '97), Chicago, Ill., Jun. 16–19, 1997, pp. 999–1002; Ziaie, et al., "A Generic MicroMachined Silicon Platform for Low-Power, Low Loss Miniature Transceivers," Digest of Tech. Papers, 1997 Int'l. Conf. Solid-State Sensors and Actuators (Transducers '97), Chicago, Ill., Jun. 16–19, 1997, pp. 257–260.

In an alternate approach, a ferromagnetic thin film is deposited under the loop as a core. Such an approach involves additional thin film processing that may prove to be CMOS incompatible. Moreover, such an implementation is not applicable for a device operating at rf frequencies.

In yet a third approach, a MEMS-based inductor is suspended on hinged, polysilicon plates over a silicon substrate. Two or four hinged, micromachined, polysilicon plates are arranged symmetrically about a frame that supports a spiral element (i.e., the inductor coil). A first edge of each plate is hinged to the supporting frame. A remote second edge of each of at least two of those plates ("the driven plates") are hinged to actuators, such as "scratch" drives disposed on the substrate surface. The driven plates are located on opposite sides of the supporting frame. As a voltage is applied to the actuators, they move towards one another, forcing the second edge of each driven plate towards one another. Since the driven plates are hinged at their first end to opposite sides of the frame, said first ends of the driven plates rise as the second edges moves towards one another. As the first ends of the plates rise, the frame and spiral element depending therefrom rise as well. See Fan et al., "Universal MEMS Platforms for Passive RF Components: Suspended Inductors and Variable Capacitors," IEEE Proc. Eleventh Annual Int'l. Conf. MEMS, Jan. 25–29, 1998, Heidelberg, Germany, pp. 29–33.

The aforedescribed suspended inductor suffers from several drawbacks as regards monolithic integration. First, the inductor must be assembled after fabrication hereinafter "actively assembled"), leading to many of the same drawbacks as for a MCM. In other words, after the various plates and structures forming the inductor are fabricated, a separate step must be performed on the working inductor wherein the actuators are energized to suspend the inductor. Second, as the inductance of the final device depends on the gap between the inductor coil and the substrate, either the gap, the inductance, or the circuit performance must be monitored during this active-assembly step. In a commercial process in which a MEMS-based inductor is monolithicaily integrated in a silicon chip, such separate actuation and monitoring steps are impractical and typically unacceptable. Moreover, in the prior art suspended inductor, electrical connection to the inductor coil is disadvantageously made through hinged joints having incomplete metallization.

As such, the art would benefit from a MEMS-based inductor that avoids the drawbacks of the prior art and is readily monolithically integrable into various circuits, such as, for example, wireless telecommunication circuits.

SUMMARY OF THE INVENTION

In accordance with an illustrative embodiment of the present invention, a low loss, micro-machined passively self-assembling inductor is disclosed. In some embodiments, the inductor is fabricated using MEMS technology and advantageously utilizes materials compatible with silicon IC fabrication, and particularly CMOS production, such that the inductor is monolithically integrated on a CMOS chip.

In a first embodiment, the inductor consists of a conductive loop or spiral having one or more turns that is suspended above a substrate, such as silicon, by at least two conductive supports incorporating passive self-assembly means. In one embodiment, the passive self-assembly means comprises a layer having a high level of intrinsic stress that is incorporated on the conductive supports.

The stressed layer is deposited on top of the structural layer (e.g., polysilicon) of the conductive supports. When the supports and other features of the inductor are "released" during the fabrication process by removing certain sacrificial layers, the stressed layer contracts to reduce residual strain. As a result, an upwardly-directed force is imparted to the free end of the supports from which the conductive loop depends. As a consequence, the supports and the loop rise up, away from the substrate.

In another embodiment of an inductor in accordance with the present teachings, a planar spiral member is "folded" along its mid-line in the manner of a "taco." The spiral member contacts the substrate substantially only along the fold line. The spiral member itself includes the passive self-assembly means. In one embodiment, such means comprises the stressed layer described above. When the spiral is released during fabrication, the stressed layer contracts causing the unrestrained perimeter of the inductor to raise, forming the familiar "taco" shape.

In a third embodiment, hinged structures including means for passive self assembly maintain an inductor loop in a substantially orthogonal orientation with respect to the substrate Such an orthogonal orientation results in improvements in inductor performance relative to the first two embodiments.

BRIEF DESCRIPTION OF THE INVENTION

FIGS. 4b–4c depict the passive assembly of a hinged plate, such as is used in the inductor of FIG. 4a.

FIG. 6b depicts a modification of the circuit of FIG. 6a.

DETAILED DESCRIPTION

Figure 1:
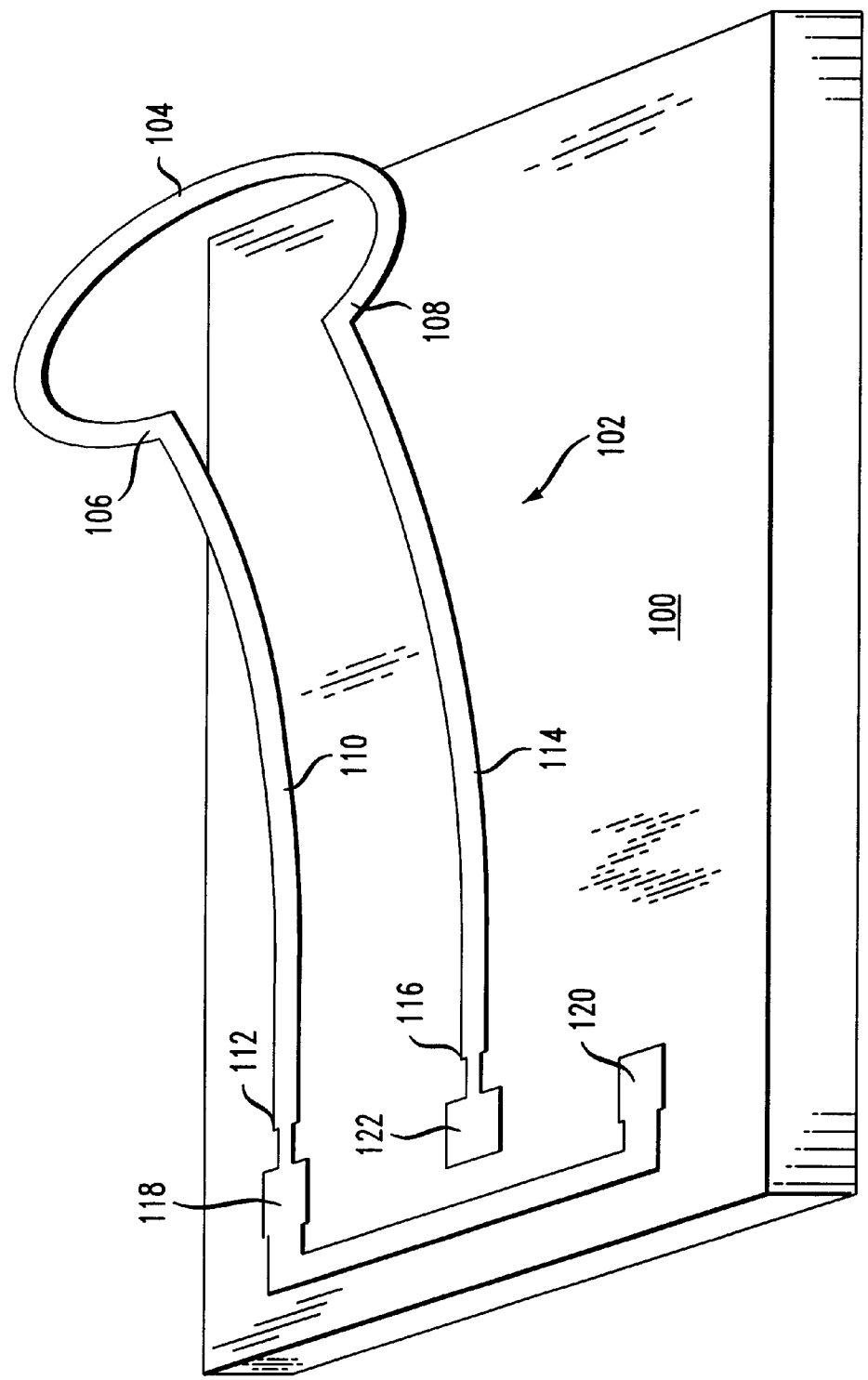
FIG. 1 depicts a first MEMS-implemented inductor in accordance with an illustrative embodiment of the present invention.

FIG. 1 depicts a first inductor 102 in accordance with an illustrative embodiment of the present invention. Illustrative inductor 102 comprises conductive loop 104, conductive supports 110 and 114 incorporating passive self-assembly means, and three electrical contacts 118, 120 and 122, interrelated as shown. First end 106 of loop 104 depends from conductive support 110, and second end 108 of loop 104 depends from conductive support 114. Conductive supports 110 and 114 provide electrical connection to loop 104 and also function to physically separate loop 104 from substrate 100.

For measurement purposes, first end 112 of conductive support 110 is electrically connected to ground contact 118. First end 116 of conductive support 114 is electrically connected to signal contact 122. A second ground contact 120 is electrically connected to contact 118. Ground contacts 118 and 120 are arranged in flanking relation to signal contact 122, providing the familiar ground-signal-ground arrangement. Such an arrangement provides guiding to a relatively high-frequency signal (e.g., greater than about 10 GHz) being delivered to signal contact 122.

Technology for fabricating the aforedeseribed inductor is commercially available from a variety of sources, such as, for example, the MEMS Microelectronics Center of North Carolina (MCNC). One of the technologies offered by MCNC is a three-polysilicon-layer surface micromachining process. The first deposited polysilicon layer, referred to as "POLY0," is non-releasable and is typically used for patterning address electrodes and local wiring on a substrate, such as a silicon wafer. The upper two polysilicon layers, referred to as "POLY1" and "POLY2," are releasable and so can be used to form mechanical structures. The POLY1 and/or POLY2 layers are released by etching away sacrificial oxide layers that are deposited between the polysilicon layers during fabrication.

The polysilicon layers POLY0, POLY1 and POLY2 have nominal thicknesses of 0.5, 2, and 1.5 microns, respectively. The polysilicon and oxide layers are individually patterned, and unwanted material from each layer is removed by reactive ion etching before the next layer is added. Optionally, a layer of metal, nominally 0.6–1.3 microns in thickness, may be deposited on the POLY2 layer. MCNC's three-layer process, as well as other MEMS fabrication processes, are now quite familiar to those skilled in the art.

An illustrative fabrication method for inductor 102 based on the aforedescribed MCNC three-layer process is described below and depicted in FIGS. 2a–2h For clarity of illustration, the fabrication of only one of the supports is shown. Certain layers of material that are deposited when using the MCNC process are not utilized when forming the present structure. To the extent that such unnecessary layers are deposited on the present structure during fabrication, they are completely removed in later lithographic steps. Such un-utilized layers are omitted for clarity of presentation. In the following description and the accompanying Figures, the MCNC designations for the various polysilicon layers will be used.

Figure 2A:
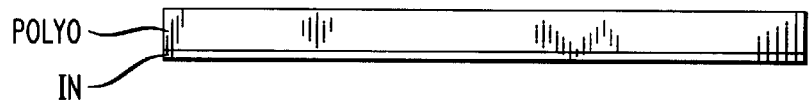
FIGS. 2a–2h depict illustrative steps in the fabrication of the inductor of FIG. 1.
Figure 2B:
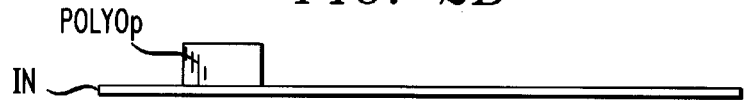

As depicted in FIG. 2a, a first layer POLY0 of polysilicon is deposited on an insulating layer IN, such as silicon nitride. The layer POLY0 is then patterned, using an appropriate masks. The as-patterned layer $POLY0_p$, which will function as an "anchor" for a conductive support, is shown in FIG. 2b.

Figure 2C:
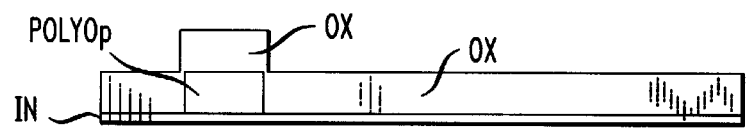
Figure 2D:

Subsequently, a layer OX of oxide is deposited over the layer IN and the layer $POLY0_p$, as depicted in FIG. 2c. Next, layer OX of oxide is patterned as shown in FIG. 2d.

Figure 2E:
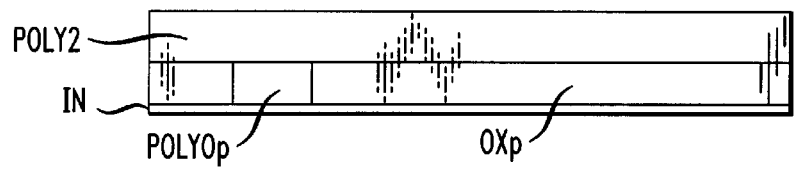
Figure 2F:
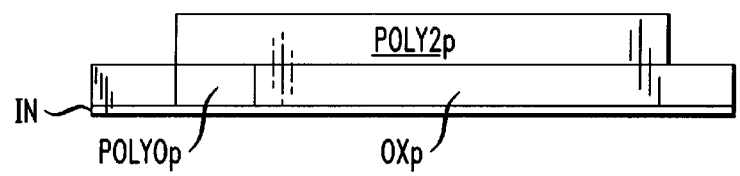

In FIG. 2e, a layer POLY2 of polysilicon is deposited on the patterned layers $OX_p$ and $POLY0_p$. The loop (i.e., loop 104 shown in FIG. 1) and supports (i.e., supports 110 and 114 shown in FIG. 1) are formed from the layer POLY2. As such, the layer POLY2 is patterned, using an appropriately-configured mask, into such structures. The patterned layer $POLY2_p$ is depicted in FIG. 2f.

Figure 2G:
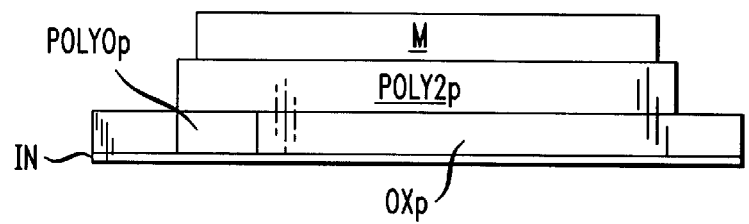
Figure 2H:
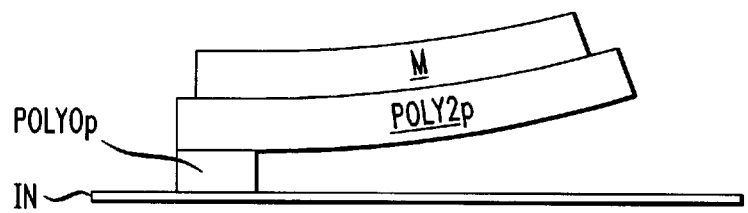

After patterning the layer POLY2, a layer M of metal is deposited on layer $POLY2_p$, and then patterned. The metal is deposited over the supports, as well as the loop, and provides a conductive surface. FIG. 2g depicts the patterned layer M on the patterned layer $POLY2_p$. Finally, the layer OX of oxide is etched, such as with HF, releasing the patterned layer $POLY2_p$, as is depicted in FIG. 2h.

In some embodiments, two layers of metal, as opposed to a single layer, are deposited everywhere on inductor 102 to reduce electrical resistance as compared to a single layer. In still other embodiments, three or more layers of metal are used to further reduce electrical resistance. Any one of a variety of metals may suitably be used for such purpose, including for example, aluminum, copper, silver or gold. As is known to those skilled in the art, gold is typically not used in conjunction with CMOS processes. As such, in embodiments such as those described later in this Specification in which the present inductor is incorporated into a CMOS chip, the other metals listed above should be used in preference to gold.

Referring again to FIG. 2h, as patterned layer $POLY2_p$ is released, it warps, such that the non-anchored end (where the inductor loop is) moves upwardly away from the layer IN disposed on the substrate. Such upward warping results from incorporating the aforementioned passive self-assembly means.

In one embodiment, passive self-assembly means comprises a layer of material that is deposited to have a high level of intrinsic stress ("stressed layer"). The stressed layer is deposited over the structural layer (e.g., the polysilicon) of the structure that is to be warped. For example, in the above-described method, the stressed layer is deposited on top of the patterned layer $POLY2_p$, as is described in more detail below.

In the illustrative method, metal was deposited on the POLY2 layer to provide a conductive surface. That metal is typically gold (for non-CMOS applications). Gold does not, however, adhere well to polysilicon. As such, a thin adhesion layer is often deposited on the POLY2 layer before depositing gold. In one embodiment, the material serving as an adhesion layer is, advantageously, the passive self-assembly means. In such an embodiment, chromium is advantageously used as the adhesion layer/passive self-assembly means. A high intrinsic stress is associated with the deposited chromium layer. When the sacrificial oxide layer is etched away to release the patterned layer $POLY2_p$, the chromium layer contracts to minimize strain. Upon such contraction, an upwardly-directed force is imparted to the un-anchored end of patterned layer $POLY2_p$, causing it to warp in an "upwards" direction. Thus, in inductor 102, loop 104 is moved into operating position off of substrate 100 by virtue of the warping of supports 110 and 114. See, U.S. patent application Ser. No. 08/997,175, previously referenced. Other materials capable of developing a suitably high intrinsic stress may be used instead of chromium.

In an alternative embodiment (not shown), patterned layer $POLY2_p$ is fabricated with compressive stress, and an overlying layer (e.g., metal) is deposited with low stress. Upon release, the $POLY2_p$ layer expands, causing the same upwardly-directed warp.

In the aforedescribed illustrative fabrication method, the POLY1 layer of the MCNC process is not used; rather the POLY2 layer is used. There are several reasons for this. First, since the POLY2 layer, at 1.5 microns, is thinner than the POLY1 layer (2 microns), the POLY2 will be more amenable to "warping," as is desired for raising the supports 110 and 114 and loop 104 up and away from the substrate. Second, to impart the requisite conductivity to the supports and the loop, metal is advantageously deposited on the structural (e.g., polysilicon) layer comprising those structures. In the MCNC process, metal cannot be deposited on the POLY1 layer, but can be deposited on the POLY2 layer.

While the above-described method utilized MCNC's three-polysilicon layer MEMS fabrication technology, it should be understood that inductor 102 can be fabricated using other surface micromaching processes.

Figure 3:
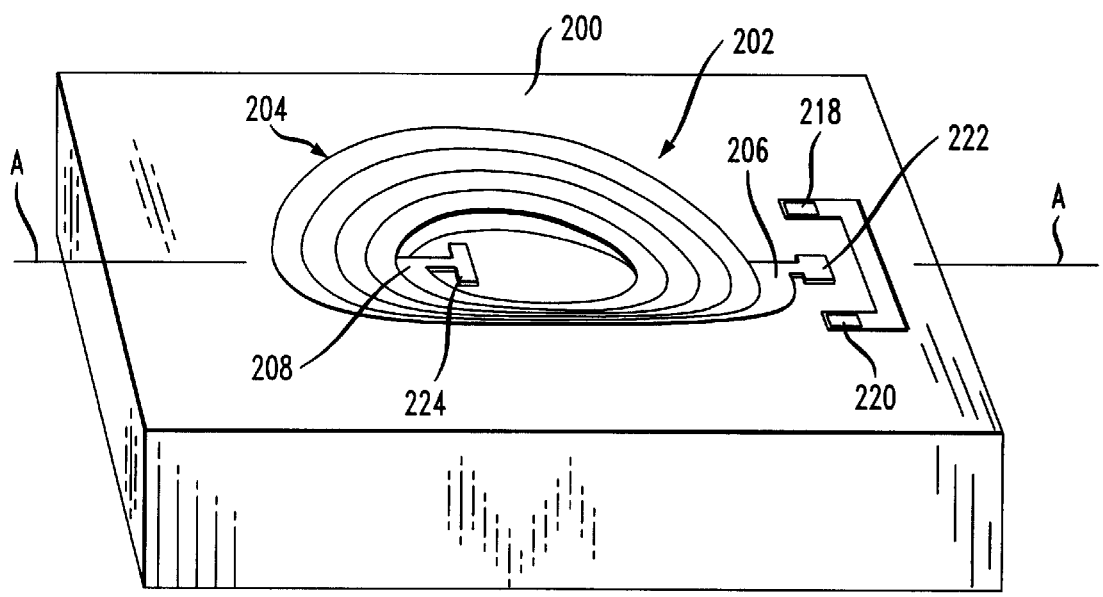
FIG. 3 depicts a second MEMS-implemented inductor in accordance with an illustrative embodiment of the present invention.

FIG. 3 depicts a second inductor 202 in accordance with an illustrative embodiment of the present invention. Illustrative inductor 202 comprises conductive spiral 204 including passive self-assembly means, and four electrical contacts or pads 218, 220, 222 and 224, interrelated as shown First end 206 of spiral 204 is electrically connected to signal contact 222 and second end 208 of spiral 204 is electrically connected to return contact 224. In the illustrated embodiment, a conductive substrate is used as a return to grounds 218 and 220. First and second ground contacts 218 and 220 are electrically connected to one another and arranged in flanking relation to signal contact 222, providing a ground-signal-ground arrangement Pads 218–224 are deposited on an underlying electrically insulating layer (not shown) disposed on substrate 200, such that pads 222 and 224 anchoring inductor 202.

A portion of spiral 204 aligned with diameter A—A rests on, but is not anchored to, underlying substrate 200. The spiral 204 is "folded" along diameter A—A, dividing the spiral into two portions, each of which portions curve upwardly away from substrate 200. Inductor 202 can be fabricated applying the aforedescribed surface micromaching methods, adapted as required for differences in structure.

In one embodiment, the passive self-assembly means comprises a stressed layer, such as is described in conjunction with the previous embodiment. For inductor 202, the stressed layer is deposited over the structural layer (e.g., polysilicon) of spiral 204. To promote "folding" of inductor 202, dimples are advantageously patterned in layer OX (i.e., the OXIDE1 layer of the MCNC 3-layer process) along axis A—A. Such dimples, which are repeated in the POLY2 layer forming the inductor spiral, weaken the spiral, facilitating folding along axis A—A as the spiral warps. Since inductor 202 is anchored to the underlying layer (i.e., an insulating layer disposed on top of the substrate) at the pads 222 and 224 along the axis A—A, spiral 204 warps upwardly on either side of axis A—A, forming the familiar "taco" shape.

Figure 4A:
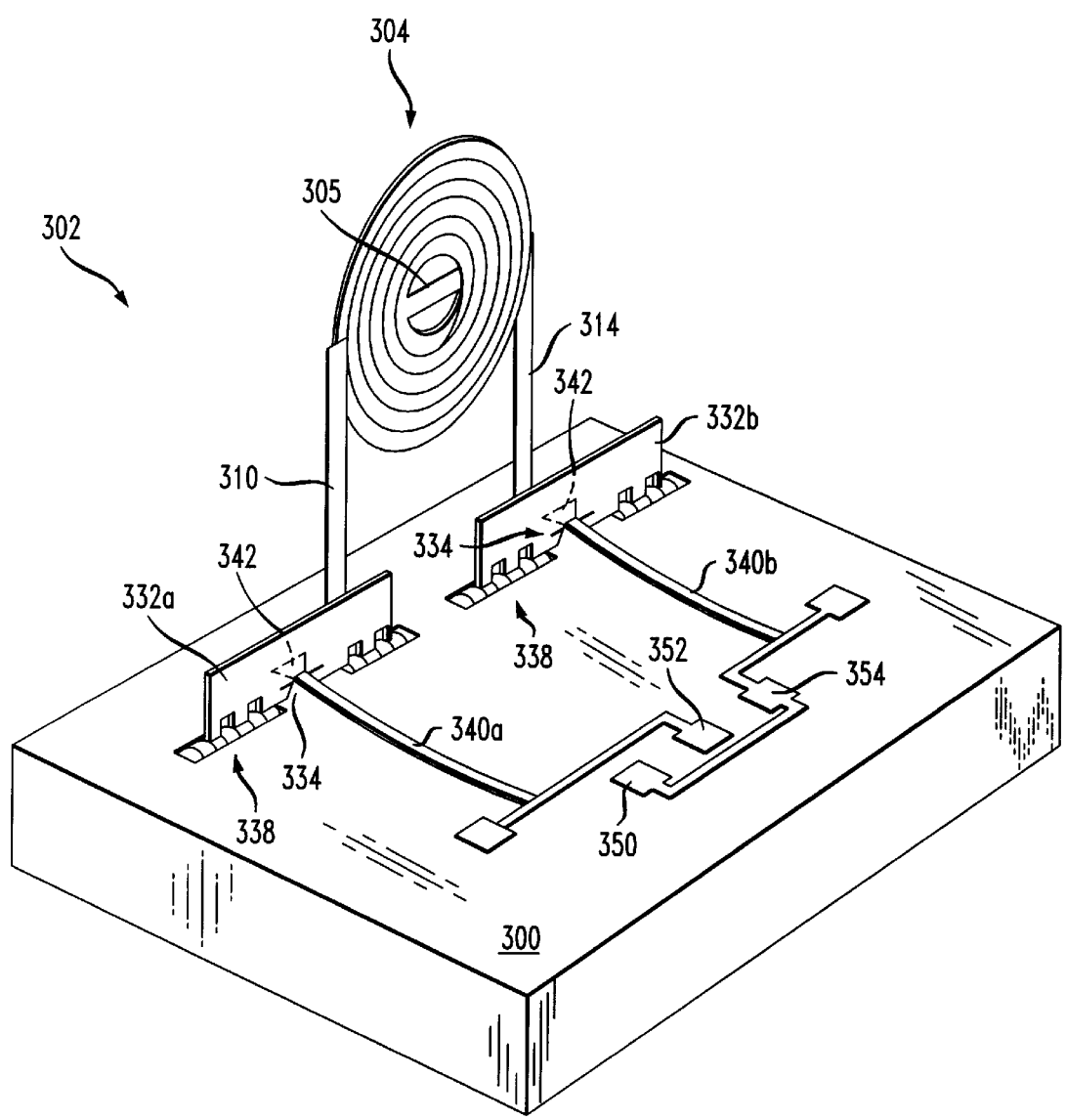
FIG. 4a depicts a third MEMS-implemented inductor in accordance with an illustrative embodiment of the present invention.

There will be some degree of interaction (e.g., electrical losses, inductive coupling, parasitic capacitances) between inductor 102/202 and its respective substrate due to the proximity and relative orientation of the loop/spiral element to such substrate. Such interaction is reduced to essentially negligible levels in an inductor 302 in accordance with an illustrative embodiment of the present invention. Inductor 302 is depicted in FIG. 4a.

Spiral 304 of inductor 302 is disposed in orthogonal relation to substrate 300. Conductive supports 310 and 314 support spiral 304 in an upright, out-of-the-plane-of-the-substrate orientation. Conductive supports 310 and 314 are attached to respective conductive hinged plates 332a and 332b. The hinged plates are rotatably attached to substrate 300 by hinges 338. The formation of such hinged plates is known in the art. See, for example, Pister et al., "Microfabricated Hinges," v. 33, Sensors and Actuators A, pp. 249–256, 1992. See also, assignee's co-pending U.S. patent applications entitled "Micro Machined Optical Switch," filed May 15, 1997 as Ser. No. 08/856,569 and "Methods and Apparatus For Making a Micro Device," filed May 15, 1997 as Ser. No. 08/056,565, both of which applications are incorporated by reference herein.

Hinged plates 332a/332b have a v-shaped notch 334 that receives a v-shaped engagement member 342 that depends from a first end of conductive passive actuating elements 340a and 340b. In the present embodiment, passive self-assembly means comprises the aforementioned v-shaped notch 334, v-shaped engagement member 342 and passive actuating elements 340a and 340b. Contacts 350, 352 and 354, arranged in the well-known ground-signal-ground arrangement, provide electrical connection to spiral 304 through the passive actuating elements, hinged plates and conductive supports. Segment 305 depending from the inner end of spiral 304 provides a return path through support 314, hinged plate 332b and passive actuating element 340b to ground contacts 350 and 354.

As formed, spiral 304, conductive supports 310/314, hinged plates 332a/332b and passive actuating elements 340a/340b lie flat on the surface of substrate 300 (or on an insulating layer disposed on the substrate). In that pre-assembled condition, a portion of v-shaped engagement member 342 of actuating element 340a lies beneath v-shaped notch 334 of hinged plate 332a. (See FIG. 5a) Similarly, a portion of v-shaped engagement member 342 of actuating element 340b lies beneath v-shaped notch 334 of hinged plate 332b.

Passive actuating elements 340a and 340b comprise a stressed layer that can be implemented in the manner previously described. When the various structural elements of inductor 302 are released during the final fabrication steps, the stressed layer contracts to minimize strain, causing passive actuating elements 340a/340b to rise up and away from substrate 300. A maximum displacement between substrate 300 and the passive actuating elements occurs at the first end wherein the v-shaped engagement member 342 is disposed and a minimum (no displacement) occurs at a second end wherein the passive actuating elements 340a/340b are anchored to the substrate (or to overlying layers).

Figure 4B:
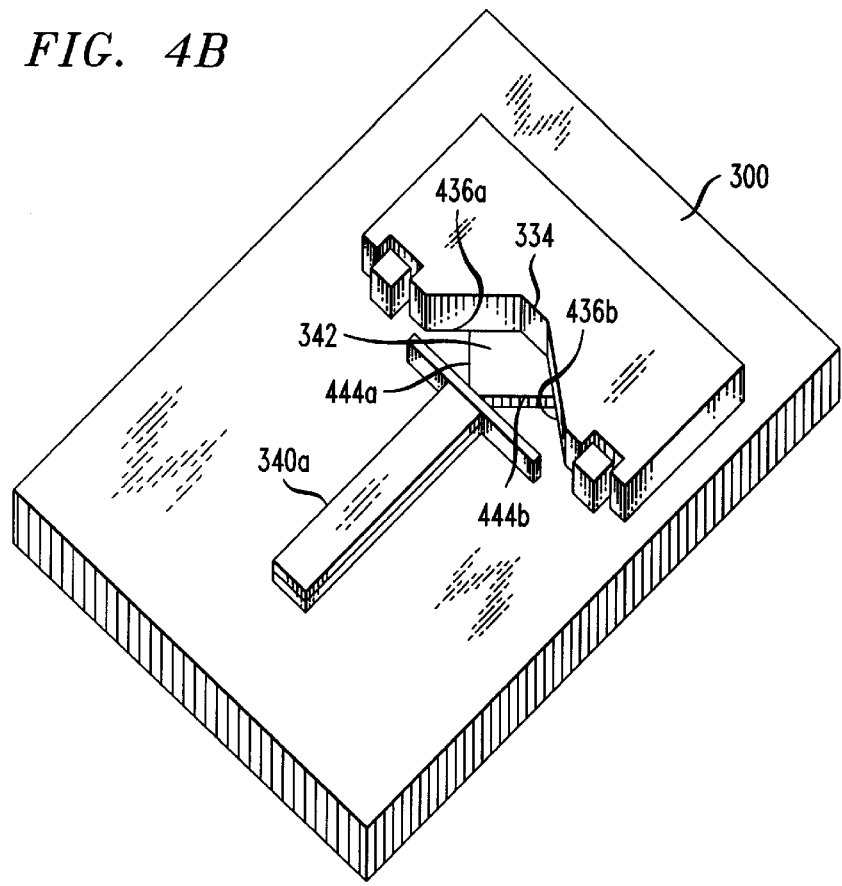
Figure 4C:
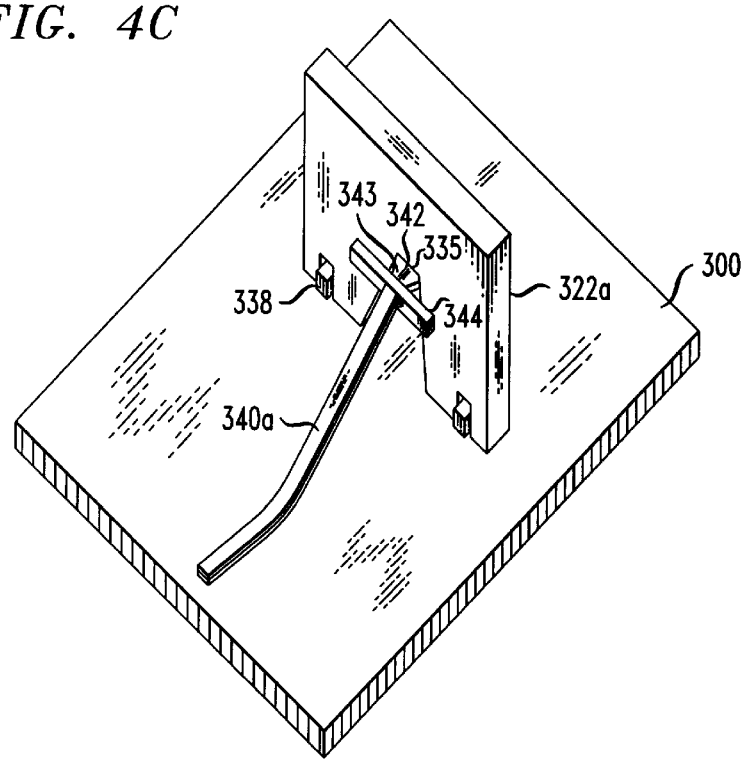

FIGS. 4b and 4c depict the passive assembly process for the illustrative inductor depicted in FIG. 4a. FIGS. 4b and 4c show only a single hinged plate and passive actuating element for clarity of presentation.

FIG. 4b depicts hinged plate 332a and passive actuating element 340a lying on substrate 300. As a surrounding oxide layer (not shown) is released, and passive actuating element 340a begins to rise, edges 436a/436b of v-shaped notch 334 in hinged plate 332a slide over edges 444a/444b of v-shaped engagement member 342. As such sliding engagement occurs, hinged plate 332a is rotated up and away from substrate 300 about its hinges 338. With continued upwardly-directed force, the vertex 343 of v-shaped engagement member 342 and vertex 335 of v-shaped notch 334 converge to a final position, depicted in FIG. 4c. In the final position, hinged plate 332a is substantially orthogonal to substrate 300, having been rotated about ninety degrees out-of-plane about hinges 338. Stop 344 prevents hinged plate 332a from "flipping-over" and falling towards substrate 300 on top of passive actuating element 340a. See the present assignee's copending patent application entitled "Self-Assembling Micro-Mechanical Device," filed Dec. 22, 1997 as U.S. patent application Ser. No. 08/997,175, incorporated herein by reference.

As is well known, the performance of inductors, such as illustrative inductors 102, 202 and 302, is dictated by geometric considerations, and, of course, the proximity of the inductor loop/spiral to the substrate. Regarding geometric considerations, in illustrative inductor 102, loop 104 comprises a single (or more properly, a partial) turn. In other embodiments, the loop can comprise additional turns to provide more inductance. For example, in illustrative inductor 202, spiral 204 comprises three turns. It should be understood that the three illustrative inductors 102, 202 and 302 can be fabricated as a loop (i.e., a partial turn to a full turn) or a spiral (more than one turn).

Other attributes being equal, a spiral (i.e., multiple turns) inductor has a greater inductance than a loop (ie., single turn) inductor. A spiral inductor disadvantageously requires a return path underneath the multiple turns. Such a return path is provided by a conductive substrate in the embodiment depicted in FIG. 2, and by segment 305 in the embodiment depicted in FIG. 4a. The aforedescribed disadvantage is avoided in a fourth and fifth embodiment of the present inductor, depicted in plan views FIGS. 5a and 5b, respectively.

Figure 5A:
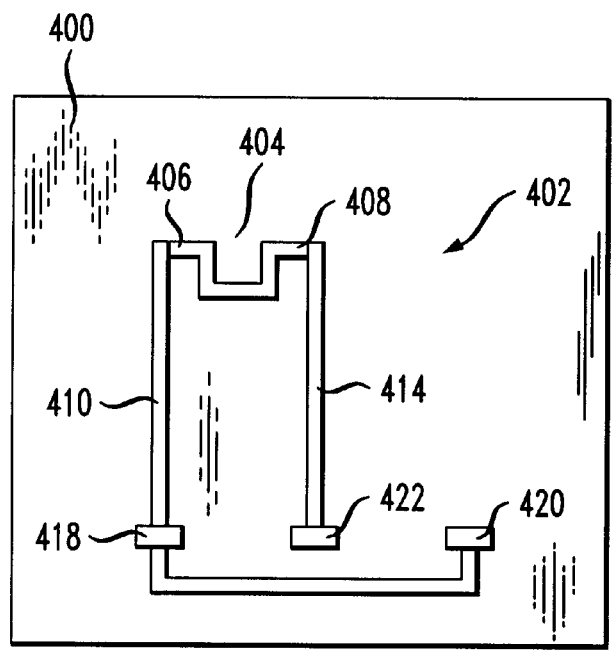
FIG. 5a depicts a fourth MEMS-implemented inductor in accordance with an illustrative embodiment of the present invention.

FIG. 5a depicts a plan view of inductor 402. Inductor 402 comprises meander line 404, conductive supports 410 and 414 incorporating passive self-assembly means, and three electrical contacts 418, 420 and 422, interrelated as shown. First end 406 of meander line 404 depends from conductive support 410, and second end 408 of meander line 404 depends from conductive support 414. Conductive supports 410 and 414 provide electrical connection to meander line 404 and also function to physically separate the meander line from an underlying substrate 400. Conductive support 410 is anchored, and electrically connected, to ground contact 418. Ground contact 418 is electrically connected to ground contact 420 providing a ground-signal-ground arrangement. Conductive support 414 is anchored, and electrically connected, to signal contact 422.

Figure 5B:
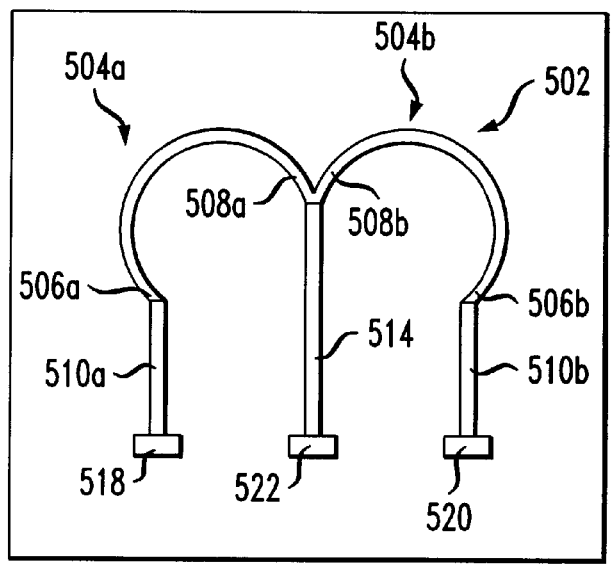
FIG. 5b depicts a fifth MEMS-implemented inductor in accordance with an illustrative embodiment of the present invention.

FIG. 5b depicts inductor 502. Inductor 502 comprises dual loops 504a and 504b, conductive supports 510a, 510b and 514 incorporating passive self-assembly means, and three electrical contacts 518, 520 and 522, interrelated as shown. First end 506a of loop 504a depends from conductive support 510a, and first end 506b of loop 504b depends from conductive support 510b. Second end 508a of loop 504a and second end 508b of loop 504b depend from conductive support 514. Conductive support 510a is anchored, and electrically connected, to ground contact 518. Conductive support 510b is anchored, and electrically connected, to ground contact 520. And conductive support 514 is anchored, and electrically connected, to signal contact 522.

The convolutions of meander line 404 increase the inductance of inductor 402 relative to an inductor having an non-convoluted loop, such as illustrative inductor 102 depicted in FIG. 1. The interacting fields of loops 504a and 504b increase the inductance of inductor 502 relative to the solitary loop of illustrative inductor 102 depicted in FIG. 1. Thus, illustrative inductors 402 and 502 advantageously possess the higher inductance of a "spiral" inductor, yet do not require a return path.

As used hereinafter in this Description and the Claims, the term "loop" is intended to encompass an inductor element configured as a loop partial or single turn), spiral (multiple turns), meander line and dual loops, as those terms are defined/described above.

Other relevant geometric considerations include, for example, spacing between the turns, loop diameter, "wire" size, and the like. The performance of the various embodiments of the present inductor can be simulated using commercially-available electromagnetic simulation software such as SERENADE™, available from Ansoft Corporation of Pittsburgh, Pa., or MOMENTUM™, available from Hewlett Packard Company of Palo Alto, Calif.

So, unlike prior-art inductors, the present inductor can advantageously be monolithically integrated into a number of important circuits using commercial-scale processing, thereby providing a commercially-viable method for providing a single-chip version of such circuits. Illustrative applications include many very basic circuits, including for example, reactive impedance matching circuits, tank circuits, and filters. The present inductor can also be incorporated into more complex devices, such as variable-frequency oscillators (VFOs) and transceivers, that utilize such circuits. In the remainder of this specification, several improved devices utilizing a monolithically-integrated inductor in accordance with the present teachings are described.

Before describing such improved devices, commercially-available methodologies for monolithically integrating MEMS structures, such as the present inductors, with CMOS processing, are referenced. Such methodologies are generally readily adaptable to meet the needs of a particular MEMS application.

One such process is the "BiMOSIIe®" process available from Analog Devices, Inc. of Norwood, Mass. The BiMOIIe® process integrates a surface micromachining process suitable for forming MEMS structures with a CMOS process suitable for forming devices useful for analog applications. The BiMOSIIe® process nominally utilizes a single structural polysilicon layer and associated sacrificial layer (to release the structural polysilicon layer). Additional polysilicon layers can be used in this or other processes to provide more functionality as desired. Information concerning the BiMOSIIe® process is provided on Analog Devices/MCNC server pages at http://imems.mcnc.org. See also, U.S. Pat. No. 5,326,726 to Tsang et al. entitled "Method for Fabricating Monolithic Chip Containing Integrated Circuitry and Suspended Microstructure;" and U.S. Pat No. 5,620,931 to Tsang et al. entitled "Methods for Fabricating Monolithic Device Containing Circuitry and Suspended Microstructure," both of which are incorporated by reference herein.

Additionally, methods for monolithically integrating MEMS structure in a CMOS chip are offered by the University of California at Berkley, and Sandia National Labs of Albuquerque, N.M.

Figure 6A:
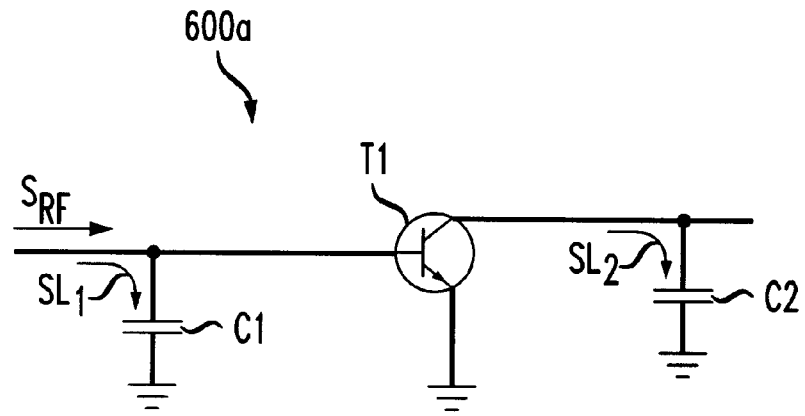
FIG. 6a depicts a typical implementation of a transistor on a substrate.

FIG. 6a depicts a portion of a circuit 600a including a typical implementation of a transistor T1 on a substrate. First capacitor C1 and second capacitor C2 are representative of parasitic capacitances that are generated by virtue of the circuitry required to implement transistor T1 on a substrate. A portion of RF signal $S_{Rf}$ is lost to such parasitic capacitances, as represented by signal loss $SL_1$ and $SL_2$. As is known in the art, such signal loss can be substantially reduced by incorporating impedance-matching elements into circuit 600a.

Figure 6B:
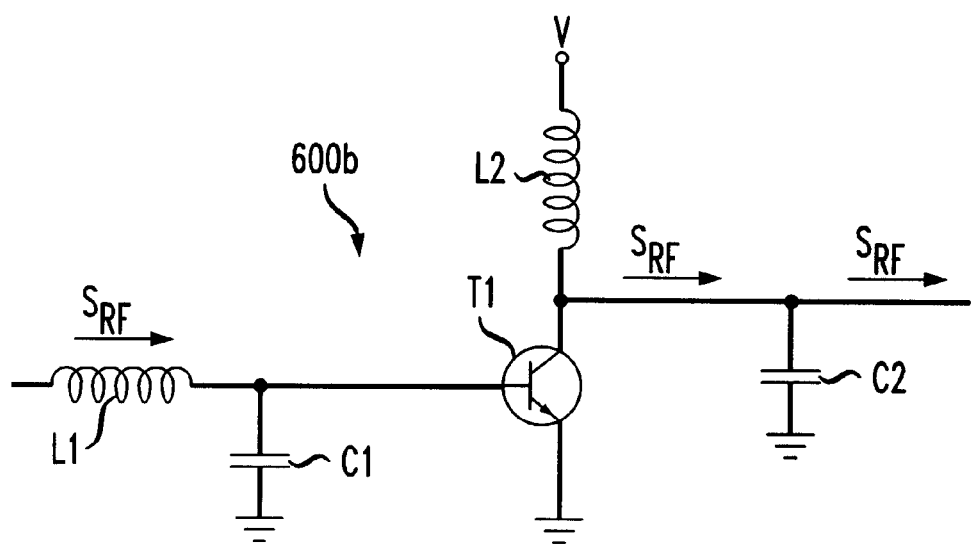

FIG. 6b depicts a modification in accordance with the present teachings of the circuit shown in FIG. 6a, wherein the present MEMS-implemented inductors are added to provide reactive impedance matching. Impedance-matched circuit 600b incorporates passive self-assembling inductors L1 and L2, which are fabricated and configured in accordance with the present teachings. Parasitic capacitances C1 and C2 are substantially canceled by virtue of the inductive reactance of inductors L1 and L2. As a result, improvements in power transfer and circuit noise performance are realized.

In another embodiment of the present invention, the present inductor is used to form an improved LC circuit, sometimes referred to as a "tank-" circuit. A LC circuit consists of an inductor and a capacitor, connected either in series or in parallel. It is a property of a LC circuit, whether a series or a parallel circuit, that when the impedance $Z_L$ (or reactance $X_L$) of the inductor and the impedance $Z_c$ (reactance $X_C$) of the capacitor are equal, the circuit is in resonance. Inductive impedance can be expressed as:

$$Z_L = jX_L = 2\pi jfL, \text{ where: } Z_L \text{ is impedance in Ohms;} \quad [1]$$
$$j \text{ is the } J \text{ operator} = (-1)^{0.5};$$
$$X_L \text{ is the inductance reactance in Ohms;}$$
$$f \text{ is frequency in Hertz; and}$$
$$L \text{ is the inductance in Henrys.}$$

Capacitive impedance can be expressed as:

$$Z_c = jX_C = 1/(2\pi jfC), \text{ where: } Z_c \text{ is impedance in Ohms;} \quad [2]$$
$$j \text{ is the } J \text{ operator} = (-1)^{0.5};$$
$$X_C \text{ is the capacitive reactance in Ohms;}$$
$$f \text{ is frequency in Hertz; and}$$
$$C \text{ is the capacitance in Farads.}$$

The potential for resonance makes LC circuits extremely useful and important Series and parallel resonant LC circuits are advantageously used, for example, as radio frequency and power supply filters, in intermediate frequency transformers of radio and television receivers, in drive and power stages of transmitters, as well in the oscillator stages of transmitters, receivers and frequency-measuring equipment.

Figure 7A:
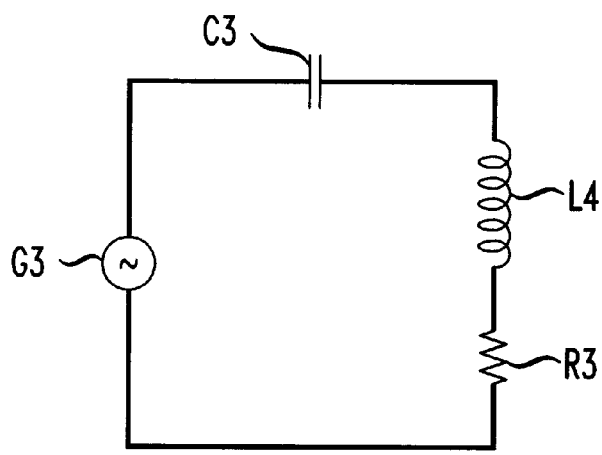
FIG. 7a depicts a conventional series LC circuit.
Figure 7B:
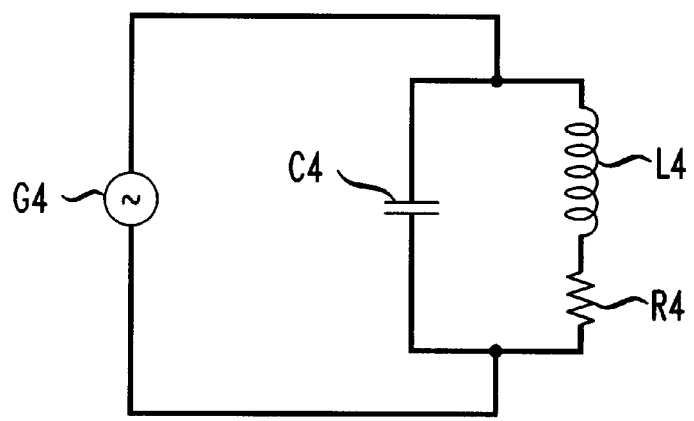
FIG. 7b depicts a conventional parallel LC circuit.

FIG. 7a depicts a conventional series LC circuit 750S, and FIG. 7b depicts a conventional parallel LC circuit 750P.

Circuit 750S includes signal source G3, capacitor C3, inductor L3 and resistor R3, connected in series as shown. Circuit 750P includes the same elements (i.e., signal source G4, capacitor C4, inductor L4 and resistor R4), but connected in a parallel configuration. Resistors R3 and R4 are not actual circuit elements, but are included to account for the inherent resistance of the circuit components, particularly the inductor.

The LC circuits of FIGS. 7a and 7b can be implemented as either fixed LC circuits or variable LC circuits. In fixed LC circuits, there is no ability to vary the inductance of the inductor or the capacitance of the capacitor. Such fixed circuits therefore have a fixed resonance. A variable LC circuit having an adjustable resonance frequency can be implemented using a fixed inductor and a variable capacitor.

A monolithically-integrable, CMOS-compatible, fixed LC circuit in accordance with an illustrative embodiment of the present invention includes a MEMS-based fixed inductor, such as illustrative inductors 102, 202 or 302 and a capacitor, such as an oxide capacitor, or a micro-machined capacitor, both known in the art. A monolithically-integrable, CMOS-compatible, variable LC circuit in accordance with an illustrative embodiment of the present invention includes a MEMS-based fixed inductor and a variable capacitor or varactor, such as a diode varactor well known in the art, or a MEMS-based variable capacitor such as is described in applicants' co-pending U.S. patent application Ser. No.: 09/152,185 filed Sep. 12, 1998, and entitled "Article Comprising A Multi-Port Variable Capacitor," attorney docket: Barber 8-25-11-1, incorporated by reference herein.

Figure 8A:
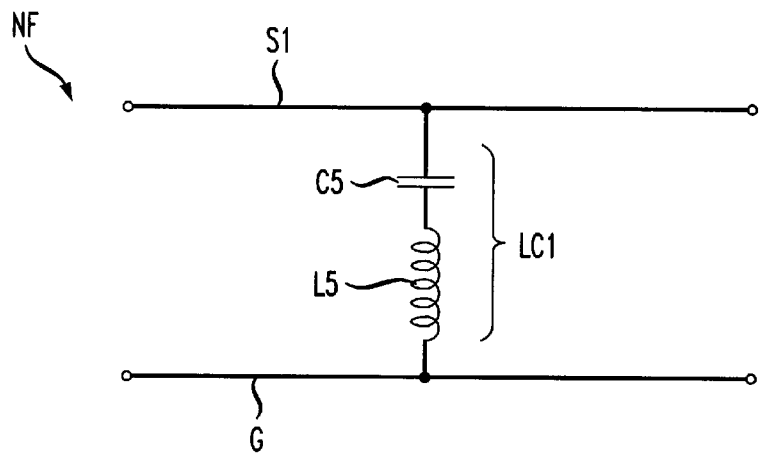
FIG. 8a depicts an illustrative notch filter incorporating the present inductor.
Figure 8B:
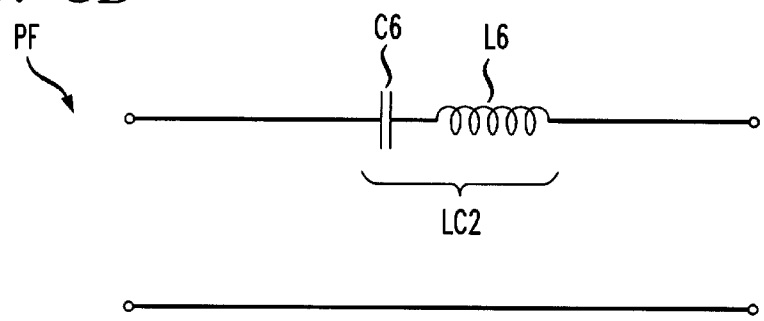
FIG. 8b depicts an illustrative pass filter incorporating the present inductor.

It is well known that LC circuits can be combined in a variety of filter applications. FIG. 8a depicts an illustrative notch filter NF in accordance with an illustrative embodiment of the present invention. Notch filter NF includes shunt resonator (LC circuit) LC1 that shunts signal line S1 to ground G. Shunt resonator LC1 includes a passive self-assembling inductor L5 in accordance with the present teachings, and a capacitor C5. Notch filter NF suppresses signal transmission at the resonant frequency of resonator LC1, and passes substantially all other frequencies. FIG. 8b depicts a pass filter PF in accordance with an illustrative embodiment of the present invention. Pass filter RF includes series resonator (LC circuit) LC2. Series LC2 includes a passive self-assembling inductor L6 in accordance with the present teachings, and a capacitor C6. Pass filter PF passes a signal at the resonant frequency of resonator LC2, and suppresses substantially all other frequencies.

Figure 8C:
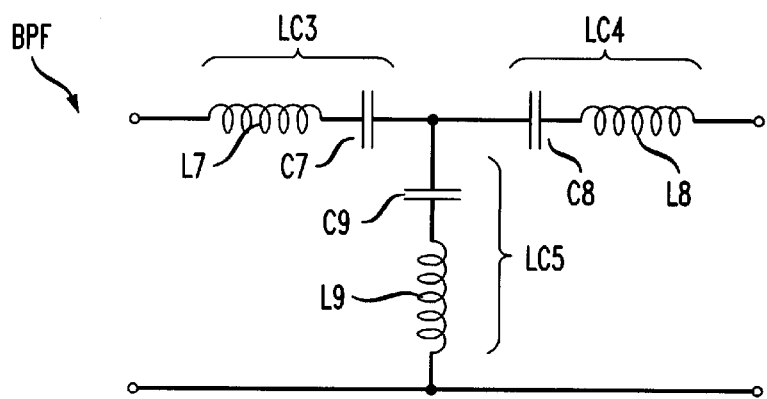
FIG. 8c depicts an illustrative band-pass filter incorporating the present inductor.

FIG. 8c depicts band pass filter BPF in accordance with an illustrative embodiment of the present invention. Band pass filter BPF includes two series resonators LC3 and LC4 and shunt resonator LC5, interrelated as shown. Resonators LC3, LC4 and LC5 include respective passive self-assembling inductor L7, L8 and L9, as well as respective capacitors C7, C8 and C9. The values of inductors L7, L8 and L9, and capacitors C7, C8 and C9 are suitably selected such that filter BPF will pass signals having a frequency within a desired band or range, and "stop" signals having frequencies outside of the band.

As desired, the capacitors used in the resonators LC1–LC5 can be fixed or variable. If variable capacitors are used, then the frequency characteristics of the resonators, and hence the filters, can be changed by an applied control voltage. Such a tunable filter is particularly advantageous for use in an equalizer for high frequency amplifiers. Such an equalizer can be used in a feedback configuration to tailor the spectrum of the amplifier to a desired function. It should be appreciated that a wide variety of other arrangements incorporating the present inductor may suitably be used to provide a filtering function.

As previously mentioned, LC circuits are important elements of more complicated devices, including, for example, VFOs. In a further embodiment of the present invention, the CMOS compatible, monolithically-integrable LC circuits previously described can be used to form a monolithically-integrable VFO. Rather than depicting specific VFO layouts, generic layouts suitable for use in conjunction with the present invention are described below. In application of the guidelines provided herein and well understood principles of oscillator design, those skilled in the art will be able to configure VFOs in accordance with the present teachings in a wide variety of ways as suits a particular application.

The present VFOs are radio-frequency oscillators. An oscillator is a device or circuit that converts DC power to RF power. The present solid-state oscillators incorporate a non-linear active device, such as a diode or transistor, which is biased so as to be in an unstable, "negative-resistance" regime. The phrase "negative resistance" is used to describe a process whereby energy is coupled into the resonant structure in a manner that allows the resonant structure to sustain rf oscillations, and is a requirement for producing net RF power.

Oscillation frequency of the oscillator is determined by load and terminating circuits, as well as by a frequency-selective network, often implemented as a resonant structure which, in the present invention, includes the present MEMS-based inductor. Capacitance can be obtained from a capacitor in an LC circuit proper that includes the MEMS-based inductor, or from other structures (e.g., capacitors within an amplification device) included in the oscillator. Moreover, by virtue of its structure, most embodiments of the present MEMS-based inductor have a capacitance associated therewith, which, in conjunction with other capacitive structures in the oscillator, provides for suitable operation of the resonant structure. By incorporating a variable capacitor into the oscillator, a variable frequency oscillator (VFO) obtains.

Figure 9:
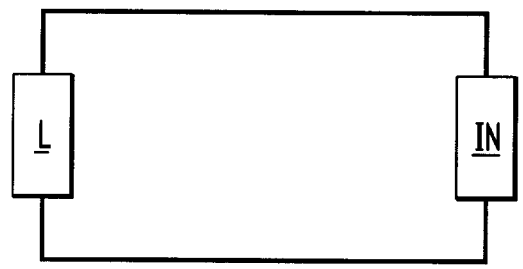
FIG. 9 is a simplified conceptual depiction of a conventional one-port negative resistance oscillator.

In one embodiment, an improved VFO in accordance with the present teachings utilize the present inductor in the well known configuration of a one-port negative-resistance oscillator. A one-port negative-resistance oscillator is conceptually depicted in FIG. 9. Such an oscillator can be conceptualized as including a load L and a negative-resistance input device IN. Typically, the negative resistance device is a Gunn or IMPATT diode, which is biased to create a negative resistance. In accordance with the present teachings, the load comprises a resonant structure, such as an LC circuit including the present passive self-assembling inductor.

Figure 10:
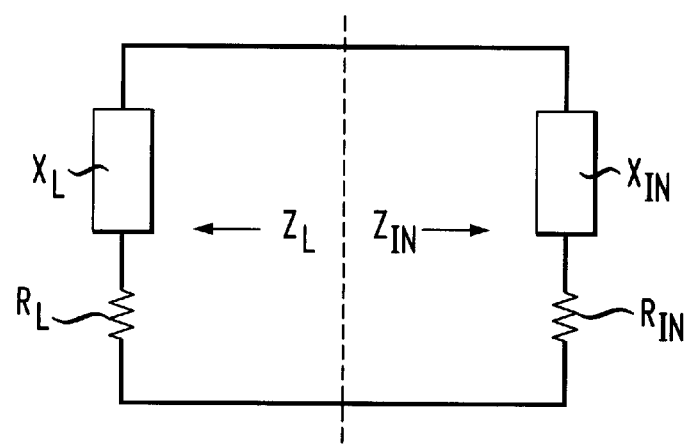
FIG. 10 depicts a model in which load L and input device IN are modeled by frequency dependent impedances $Z_L$ and $Z_{IN}$.

Load L and input device IN can be modeled by frequency dependent impedances $Z_L$ and $Z_{IN}$, as depicted in FIG. 10, wherein:

$$Z_L = R_L + jX_L, \text{ and} \quad [3]$$

$$Z_{IN} = R_{IN} + jX_{IN} \quad [4]$$

-continued where: $Z_L$ is the impedance of the load;

$R_L$ is resistance of the load;

$j$ is the J operator = $(-1)^{0.5}$;

$X_L$ is the reactance of the load;

and $Z_{IN}$, $R_{IN}$, $j$ and $X_{IN}$ are the corresponding quantities for input device IN.

It is well known that for oscillation to occur, the following equations must be satisfied:

$$R_L + R_{IN} = 0, \text{ and} \quad [5]$$

$$X_L + X_{IN} = 0. \quad [6]$$

For a passive load, $R_L > 0$, so that expression [5] implies $R_{IN} < 0$. Negative resistive $R_{IN}$ is the energy source for the oscillator. Expression [6] sets the frequency of oscillation, as follows. When load L includes a variable capacitance:

$$X_L = X_L^{(4)} + X_C; \text{ where: } X_C \text{ is capacitive reactive; and} \quad [7]$$

$$X_L^{(4)} \text{ is inductive reactance.}$$

$$X_C = 1/(\omega C); \text{ and} \quad [8]$$

$$X_L = \omega L; \text{ where: } \omega \text{ is frequency;} \quad [9]$$

$C$ is capacitance; and $L$ is inductance.

Then, the frequency of oscillation $\omega_o$ is given by:

$$\omega_o = 1/[C(X_L^{(4)} + X_{IN})], \quad [10]$$

As the magnitude of the function $-X_c$ determined by capacitance C changes, so does the frequency $\omega_o$ of the oscillator.

As is well known to those skilled in the art, oscillator design requires consideration of factors other than those described above, such as, for example, selection of an operating point for stable operation and maximum power output, frequency pulling, large signal effects and noise characteristics. Such factors are well understood by those skilled in the art, and will not be described herein.

Figure 11:
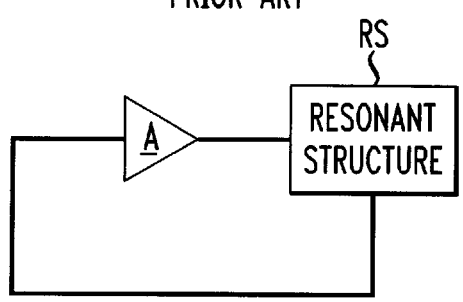
FIG. 11 depicts a conventional amplifier-based oscillator.

Another commonly used oscillator structure implements the function of negative-resistance using an amplification device. FIG. 11 depicts a conventional amplifier-based VFO. Such an oscillator includes a frequency-dependent or resonant structure RS and an amplification device A. The power output port can be on either side of amplification device A, which is commonly implemented as a transistor.

In an improved amplifier-based VFO in accordance with the present teachings, the resonant structure comprises an LC circuit including the present passive self-assembling inductor. In such a VFO, the amplifier is implemented such that it is operable, at an input, to monitor the rf signal in the resonant structure, and further operable, at an output, to inject an amplified signal into the resonant structure in a manner best suited to sustain oscillations in the resonant structure. Those skilled in the art will be able to design an amplification device suitable for providing the above-described functions.

As regards the commonly-employed transistor implementation of amplification device A, the configuration of the transistor in the oscillator depends, in large part, on the specifics of transistor. In particular, for FETs, common source or common gate configurations are typically used. For bipolar transistors, common emitter and common base configurations are more typical.

Figure 12:
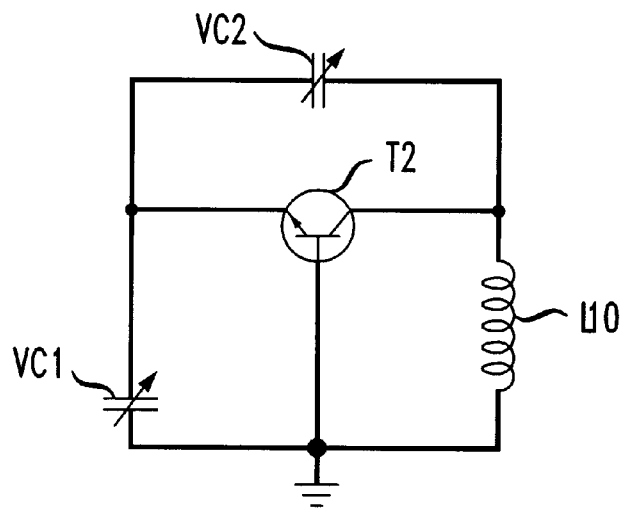
FIG. 12 depicts a simple Colpitts oscillator configuration.
Figure 13:
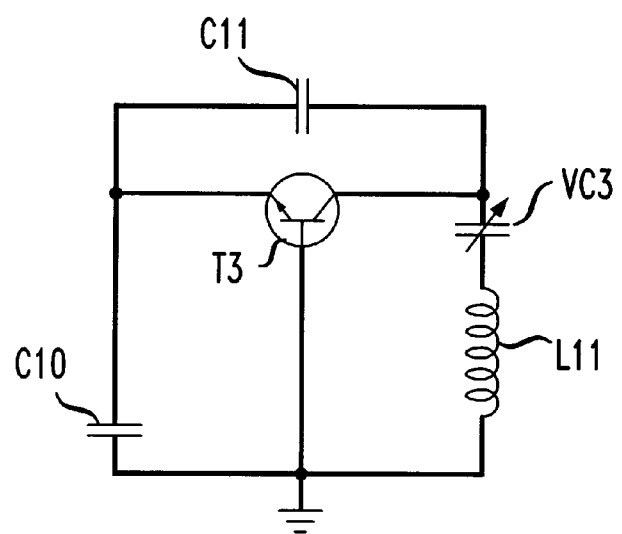
FIG. 13 depicts a simple Clapp oscillator configuration.
Figure 14:
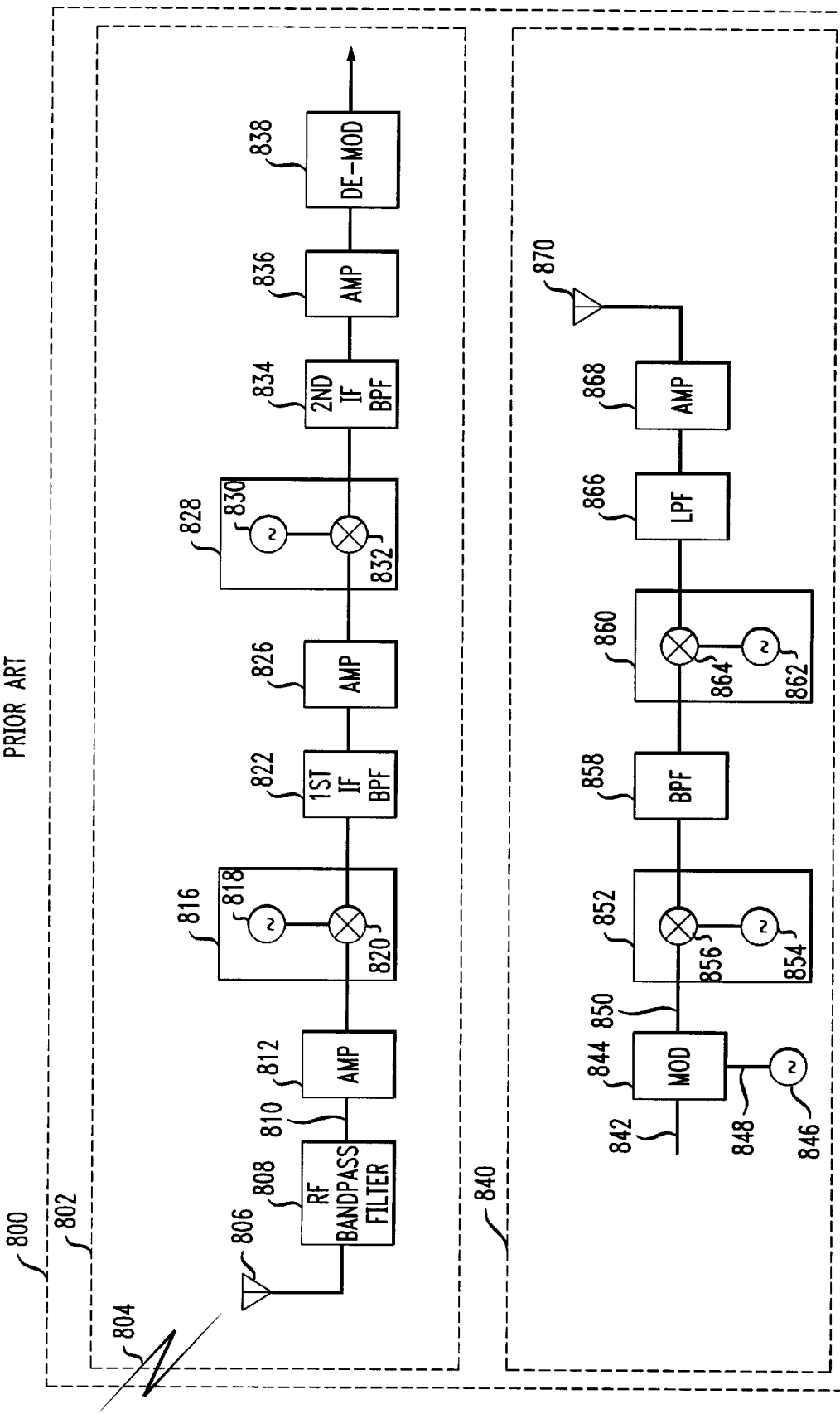
FIG. 14 depicts a simplified block diagram of a conventional transceiver.

Two well-known configurations of a transistor-based negative-resistance one-port oscillator, both suitable for use in conjunction with the present invention, include the Colpitts oscillator, depicted in a very basic embodiment in FIG. 12, and the Clapp oscillator, depicted in a very basic embodiment in FIG. 13. Both oscillators are shown utilizing bipolar transistors as their amplification element in a common-base configuration.

In the embodiment depicted in FIG. 12, the Colpitts oscillator comprises two variable capacitors VC1 and VC2, transistor T2 and inductor L5, electrically connected as shown. While both capacitors are shown as variable capacitors, in other embodiments of a Colpitts oscillator, VC2 is replaced by a fixed capacitor. In the embodiment depicted in FIG. 13, the Clapp oscillator comprises two fixed capacitors C5 and C6, variable capacitor VC3, inductor L6 and transistor T3, electrically connected as shown. Improved versions of the basic Colpitts and Clapp oscillators incorporate the passive self-assembling inductors described herein.

Figure 15:
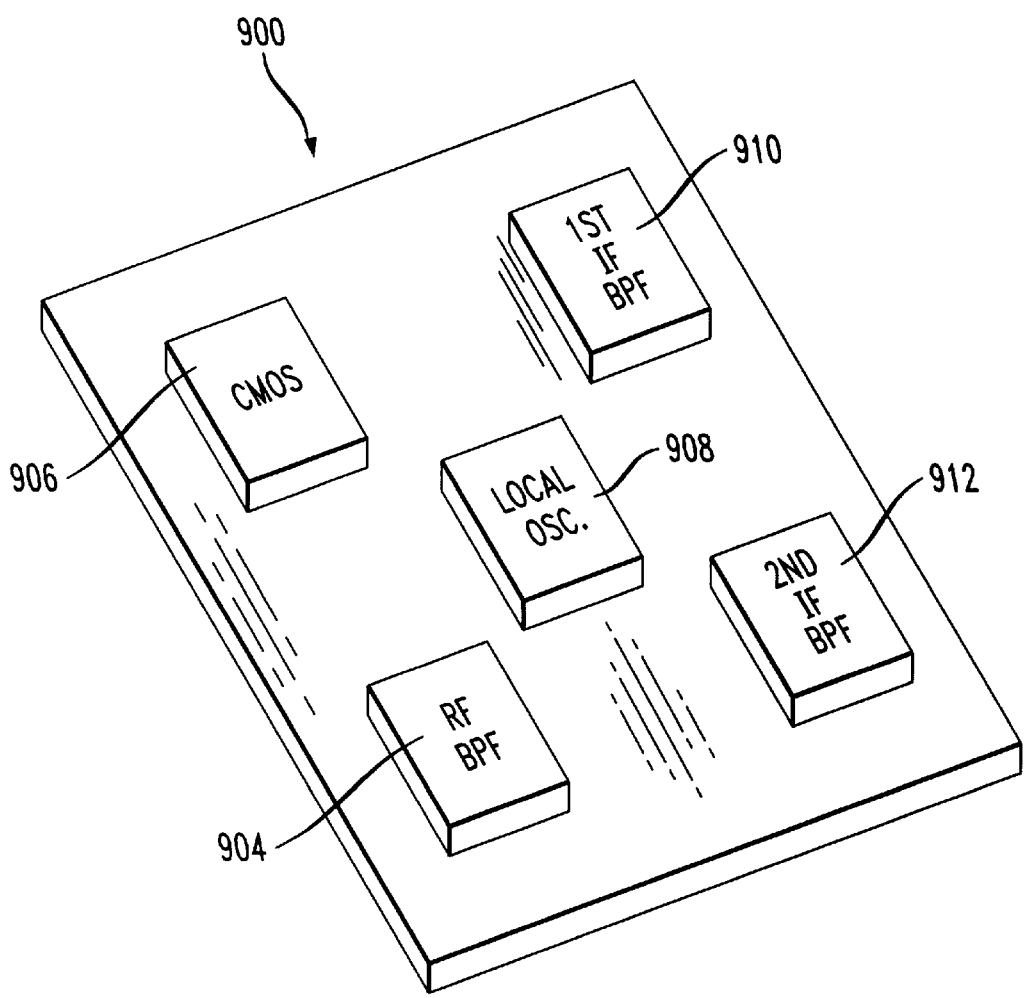
FIG. 15 depicts a board level implementation of such a transceiver.

While the more basic embodiments of the Colpitts and Clapp configurations typically use the small signal S parameter of the transistor, it should be understood that full simulation, including the large-signal response, is necessary for an optimized oscillator design The CMOS compatible, monolithically integrable inductors, LC circuits, and VFOs described above can be used to provide a single-chip implementation of a transceiver. FIG. 15 depicts a simplified block diagram of a conventional transceiver 800. Transceiver 800 includes receiver 802 and transmitter 840. Illustrative receiver 802 consists of antenna 806, RF band-pass filter 808, amplifier 812, first downconverter 816, first intermediate-frequency band-pass filter 822, first intermediate-frequency amplifier 826, second downconverter 828, second intermediate-frequency band-pass filter 834, second intermediate-frequency amplifier 836 and demodulator 838, interrelated as shown. Receiver 802 operates as follows.

Signal 804, comprising a plurality of modulated RF carrier signals having different frequencies within a first frequency band, is received by antenna 806. In addition to receiving signal 804, antenna 806 receives a plurality of undesired signals covering an extremely wide range of frequencies outside the first frequency band. Signal 804 and the undesired signals are routed to RF band-pass filter 808, which delivers an output signal 810 comprising substantially only those signals having frequencies within the first frequency band. Signal 810 is amplified in low-noise amplifier 812, which generates amplified signal 814. Signal 814 is fed to first downconverter 816.

First downconverter 816 consists of local oscillator 818, and a mixer 820. First Downconverter 816 is operable to "down convert" amplified signal 814 so that a desired one of the modulated RF carrier signals, having frequency $f_c$, is within the pass band of filter 822. More particularly, local oscillator 818 generates a frequency $f_o$, which is multiplied by the one RF carrier signal at frequency $f_c$, thereby generating a signal having frequency $\pm(f_o - f_c) = f_{i-f}$, known as the first intermediate frequency.

After downconversion, the signal passes to first intermediate-frequency band-pass filter 822. Filter 822 typically provides extreme attenuation outside its pass band. The filtered signal is then delivered to first intermediate-frequency amplifier 826. Since illustrative receiver 802 is implemented in the well known double superheterodyne arrangement, it includes second downconverter 828, which receives the amplified signal from amplifier 826. Second downconverter 828 generates a second intermediate frequency signal having a somewhat lower frequency than that generated by first downconverter 816. The downconverted signal from second downconverter 828 passes to second intermediate-frequency band-pass filter 834 and then to second intermediate-frequency amplifier 836. Like first downconverter 816, second downconverter 828 comprises local oscillator 830 and mixer 832. The signal from second intermediate-frequency amplifier 836 is passed to demodulator 838 for information retrieval. In other receiver architectures, the second down conversion may be omitted.

Illustrative transmitter 840 includes modulator 844, local oscillator 846, upconverter 852, band-pass filter 858, upconverter 860, band-pass filter 866, amplifier 868 and antenna 870, interrelated as shown. Message 842 is modulated, via modulator 844, on to a carrier signal 848 generated by local oscillator 846. Modulated output signal 850 is shifted, via upconverter 852, to an intermediate frequency (IF) that is at least twice the highest output frequency of said signal 850. Upconverter 852 consists of local oscillator 854 and mixer 856.

The IF signal leaving mixer 856 is filtered in band-pass filter 858 and then up converted to the desired output frequency by upconverter 860. Upconverter 860 includes local oscillator 862 and mixer 864. The up converted signal leaving mixer 864 is filtered in filter 866 and then amplified, in amplifier 868, to the desired power level. The amplified signal is then delivered to antenna 870 for transmission.

In conventional transceivers, the various filters utilize piezoelectric ceramics, crystals or surface acoustic waves to provide their filtering function. Presently, ceramic- and crystal-based filters cannot be monolithically integrated in to a wafer. Moreover, oscillators typically utilize conventional inductors which cannot be monolithically integrated with silicon electronics. As such, the conventional transceiver of FIG. 15 cannot be implemented as a single chip. Rather, such a transceiver is realized using several discrete components. FIG. 16 depicts an illustrative circuit-board-level implementation 900 of receiver 802 of transceiver 800.

As depicted in FIG. 16, RF band-pass filter 808, first intermediate-frequency band-pass filter 822, and second intermediate-frequency band-pass filter 834 are implemented on three different chips on circuit board 902. In particular, filter 808, a ceramic-based device, resides on chip 904, filter 822, a surface acoustic wave-based device, resides on chip 910, and filter 834, a crystal-based device, resides on chip 912. Local oscillators 818 and 830 are implemented on chip 908, while the transistor-based electronics, implemented as CMOS, reside on chip 906.

Thus, in illustrative board-level implementation 900 of FIG. 16, five chips are required to realize the receiver. Double that number for full implementation of the transceiver. In addition to the additional manufacturing steps and the relative bulk of such a conventional implementation, such a layout disadvantageously suffers from relative long signal paths, as well.

In accordance with the present teachings, a transceiver is implemented on as few as a single CMOS chip by monolithically integrating the various filters and oscillators with the transistor electronics. MEMS-based filters or other thin-film resonators suitable for use in conjunction with an improved transceiver in accordance with the present teachings can be designed and fabricated according to the teachings of U.S. Pat. No. 09/009599, filed Jan. 20, 1998 entitled "Article Comprising a Micromachined Filter," incorporated by reference herein. Moreover, other MEMS-based filters, and methods for making such filters, are known to those skilled in the art. Such filters may suitably be used for making the present transceiver. Monolithic incorporation of such oscillators is facilitated by incorporating the present MEMS-based LC circuits described above into such oscillators. Note that antennas are located off-chip.

It is to be understood that the embodiments described herein are merely illustrative of the many possible specific arrangements that can be devised in application of the principles of the invention. Other arrangements can be devised in accordance with these principles by those of ordinary skill in the art without departing from the scope and spirit of the invention. It is therefore intended that such other arrangements be included within the scope of the following claims and their equivalents.

We claim:

1. An article comprising a passively self-assembling inductor, the inductor having:
   a substrate;
   a conductive loop physically adapted to receive an electrical signal, wherein at least a portion of the loop is spaced from the substrate; and
   passive self-assembly means operable to create the space between the portion of the loop and the substrate during formation of the inductor.

2. The article of claim 1, where the passive self-assembly means comprises a stressed layer.

3. The article of claim 2, further comprising two conductive supports, each of which includes the stressed layer, wherein a first end of the conductive loop depends from a first end of one of the conductive supports and a second end of the conductive loop depends from a first end of the other of the two conductive supports, and further wherein the first end of each of the two conductive supports is spaced from the substrate.

4. The article of claim 3, wherein the conductive loop and the two conductive supports comprise metal coated polysilicon.

5. The article of claim 3, wherein the conductive loop comprises multiple turns.

6. The article of claim 2, wherein the conductive loop comprises the stressed layer, and further wherein a mid-line of the conductive loop rests on the substrate, and portions of the loop not lying along the mid-line are spaced from the substrate.

7. The article of claim 6, wherein the conductive loop comprises multiple turns.

8. The article of claim 2, further comprising:
   a conductive support that supports the conductive loop in an out-of-plane orientation relative to the substrate; and
   a hinged plate that is rotatably supported to the substrate, wherein the conductive support depends from the hinged plate;
   and further wherein passive self-assembly means further includes:
     a notch in the hinged plate;
     an engagement member depending from a first end of a passive actuating element, the passive actuating element including the stressed layer, wherein the notch receives the engagement member; wherein,
   the passive actuating element and engagement member are operable to raise and support the hinged plate in the out-of-plane orientation.

9. The article of claim 8, wherein the conductive loop comprises multiple turns.

10. The article of claim 1, wherein the article comprises a first LC circuit having a capacitor that is electrically connected to said passively self-assembling inductor.

11. The article of claim 10, wherein the LC circuit is CMOS compatible.

12. The article of claim 10, wherein the capacitor is a variable capacitor.

13. The article of claim 10, wherein the article is a filter, the filter comprising the first LC circuit, wherein the first LC circuit is electrically connected to a signal line and a ground line.

14. The article of claim 10, wherein the article is a filter, the filter comprising the first LC circuit, wherein the first LC circuit is electrically connected in series with a signal line.

15. The article of claim 1, wherein the article comprises a first oscillator including a negative resistance device electrically connected to a resonant structure comprising the passively self-assembling inductor.

16. The article of claim 15, wherein the article is a first variable frequency oscillator, the resonant structure further comprising a variable capacitor that is electrically connected to the passively self-assembling inductor.

17. The article of claim 16, wherein the negative resistance device is a transistor.

18. The article of claim 16, wherein the article comprises a transceiver, the transceiver including a receiver and a transmitter, the receiver comprising:
   a RF band-pass filter that receives a first signal from a first antenna, the first signal consisting of a first plurality of modulated RF carrier signals having different frequencies within a first frequency band and a second plurality of undesired signals covering an extremely wide range of frequencies outside the first frequency band; wherein the RF band-pass filter is operable to deliver a second signal comprising substantially only those signals having frequencies within the first frequency band;
   a first low-noise amplifier for amplifying the second signal;
   a first downconverter operable to down convert the amplified second signal to a down converted signal, the downconverter including the first variable frequency oscillator and a first mixer;
   a first intermediate-frequency band-pass filter that receives the down converted signal from the first downconverter and delivers a signal comprising one of the modulated RF carrier signals;
   a first intermediate-frequency amplifier for receiving the one modulated RF carrier signal and amplifying it; and
   a demodulator for receiving the amplified modulated RF carrier signal and demodulating it.

19. The article of claim 18, wherein the transmitter comprises:
   a second variable-frequency oscillator for generating a carrier signal;
   a modulator for modulating a message on to the carrier signal;
   an upconverter comprising a third variable-frequency oscillator and a second mixer, the upconverter operable to up convert the modulated carrier signal to an intermediate frequency (IF) modulated carrier signal;
   a band-pass filter for filtering the IF modulated carrier signal;
   an upconverter comprising a fourth variable-frequency oscillator and a third mixer, the upconverter operable to up convert the filtered IF modulated carrier signal to a desired output frequency;
   a filter for filtering the up converted modulated carrier signal; and
   an amplifier for amplifying the filtered up converted modulated carrier signal to a desired power level; wherein,
   the second, third and fourth variable-frequency oscillators comprise respective second, third and fourth CMOS-compatible LC circuits having respective second, third and fourth passively-self-assembling inductors.

20. The article of claim 19, wherein the filters are thin-film resonators.

21. The article of claim 20, wherein the transceiver is implemented in a single CMOS chip.

22. A variable-frequency oscillator, the variable-frequency oscillator having;
   a frequency selective network incorporating a passively self-assembling inductor, the inductor having:
     a substrate;
     a conductive loop physically adapted to receive an electrical signal, wherein at least a portion of the loop is spaced from the substrate; and
     passive self-assembly means operable to create the space between the portion of the loop and the substrate during formation of the inductor;
   a transistor electrically connected to the load; and
   a terminating network electrically connected to the transistor.

* * * * *